United States Patent
Yamazaki et al.

(10) Patent No.: US 10,707,018 B2
(45) Date of Patent: Jul. 7, 2020

(54) POLYCRYSTALLINE DIELECTRIC THIN FILM AND CAPACITOR ELEMENT

(71) Applicant: TDK CORPORATION, Tokyo (JP)

(72) Inventors: Kumiko Yamazaki, Tokyo (JP); Hiroshi Chihara, Tokyo (JP); Yuki Nagamine, Tokyo (JP); Junichi Yamazaki, Tokyo (JP); Yuji Umeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/069,095

(22) PCT Filed: Feb. 1, 2017

(86) PCT No.: PCT/JP2017/003579
§ 371 (c)(1),
(2) Date: Jul. 10, 2018

(87) PCT Pub. No.: WO2017/135296
PCT Pub. Date: Aug. 10, 2017

(65) Prior Publication Data
US 2019/0019622 A1    Jan. 17, 2019

(30) Foreign Application Priority Data
Feb. 1, 2016 (JP) ................. 2016-017478

(51) Int. Cl.
*H01G 4/08* (2006.01)
*H01G 4/33* (2006.01)
(Continued)

(52) U.S. Cl.
CPC ........... *H01G 4/08* (2013.01); *C01B 21/0821* (2013.01); *C23C 14/0021* (2013.01);
(Continued)

(58) Field of Classification Search
CPC ........ H01G 4/08; H01G 4/33; C01B 21/0821; C30B 29/10; C23C 14/06; C23C 16/308; H01B 3/00; C01P 2006/40; C01P 2002/34
See application file for complete search history.

(56) References Cited

U.S. PATENT DOCUMENTS

| 4,734,390 A | 3/1988 | Marchand et al. |
| 6,083,765 A * | 7/2000 | Tempel ............. H01L 27/10808 438/3 |

(Continued)

FOREIGN PATENT DOCUMENTS

| JP | S61-122108 A | 6/1986 |
| JP | 2013-001625 A | 1/2013 |
| JP | 2013-543205 A | 11/2013 |

OTHER PUBLICATIONS

Le Paven et al. Growth of (Sr,La)—(Ta,Ti)—O—N perovskite oxide and oxynitride films by radio frequency magnetron sputtering: Influence of the reactive atmosphere on the film structure. Journal of Crystal Growth, Elsevier, 2015, 413, pp. 5-11.*

(Continued)

*Primary Examiner* — Noah S Wiese
(74) *Attorney, Agent, or Firm* — Oliff PLC

(57) ABSTRACT

A polycrystalline dielectric thin film and a capacitor element have a large relative dielectric constant. The polycrystalline dielectric thin film has a perovskite oxynitride as a principal component. The perovskite oxynitride is represented by compositional formula $A_{a1}B_{b1}O_oN_n$ (a1+b1+o+n=5), and the a-axis length of the crystal lattice of the perovskite oxynitride is larger than a theoretical value.

12 Claims, 7 Drawing Sheets

(51) Int. Cl.
C23C 14/00 (2006.01)
C23C 14/06 (2006.01)
H01B 3/00 (2006.01)
C01B 21/082 (2006.01)
C30B 29/10 (2006.01)
C23C 16/30 (2006.01)

(52) U.S. Cl.
CPC .......... *C23C 14/0676* (2013.01); *C30B 29/10* (2013.01); *H01B 3/00* (2013.01); *H01G 4/33* (2013.01); *C01P 2002/34* (2013.01); *C01P 2006/40* (2013.01); *C23C 16/308* (2013.01)

(56) References Cited

U.S. PATENT DOCUMENTS

| | | |
|---|---|---|
| 2013/0003254 A1 | 1/2013 | Koutsaroff et al. |
| 2015/0228408 A1 | 8/2015 | Koutsaroff et al. |

OTHER PUBLICATIONS

Daichi Oka et al; "Possible ferroelectricity in perovskite oxynitride SrTaO2N epitaxial thin films"; Scientific Reports; 4; DOI: 10.1038srep04987; May 16, 2014; pp. 1-6.
C. Le Paven et al.; "Growth of (Sr,La)—(Ta,Ti)—O—N perovskite oxide and oxynitride films by radio frequency magnetron sputtering: Influence of the reactive atmosphere on the film structure"; Journal of Crystal Growth; 2015; pp. 5-11.
Apr. 11, 2017 International Search Report issued in International Patent Application PCT/JP2017/003579.
Aug. 7, 2018 International Preliminary Report on Patentability issued in International Patent Application PCT/ JP2017/003579.

\* cited by examiner

POLYCRYSTALLINE DIELECTRIC THIN FILM AND CAPACITOR ELEMENT

TECHNICAL FIELD

The present invention relates to a polycrystalline dielectric thin film and a capacitor element.

RELATED ART

In accordance with miniaturization and high performance of digital equipment, capacitor elements using high-performance dielectric thin films have been required.

Thin films using a metal oxide material are conventionally widely used as dielectric thin films. The improvement of characteristics of the dielectric thin films by the metal oxide material has been, however, reaching its limit, and new materials having higher characteristics are required. One of candidates of the new materials is a metal oxynitride material where some of oxygen atoms in an oxygen octahedron having a perovskite crystal structure are substituted with nitrogen atoms, but it is difficult to obtain a dielectric thin film having a metal oxynitride material.

For example, Patent Document 1 and Patent Document 2 disclose a method of manufacturing a powder of perovskite-type oxynitride $ABO_2N$, but Patent Document 1 and Patent Document 2 do not disclose that a thin film using perovskite-type oxynitride $ABO_2N$ is obtained.

Non-Patent Document 1 discloses that a thin film comprising perovskite-type oxynitride $ABO_2N$ is manufactured, but the thin film obtained in Non-Patent Document 1 is an epitaxial film.

The epitaxial film refers to a thin film manufactured by an epitaxial growth. The epitaxial growth is one of thin film crystal growth techniques, and refers to a crystal growth where a crystal growth is carried out on crystals to be a substrate and is aligned to the crystal face of the underlying substrate.

The epitaxial film is disadvantageous in that it takes a very long time to manufacture the epitaxial film. Non-Patent Document 1 discloses that it takes a long time of 530 hours or less to manufacture an epitaxial film having a thickness of 20 nm or less.

PATENT DOCUMENT

Patent Document 1: Japanese Laid-Open Patent Publication No. S61-122108
Patent Document 2: Japanese Laid-Open Patent Publication No. 2013-001625

NON-PATENT DOCUMENT

Non-Patent Document 1: Scientific Reports 4. DOI: 10.1038/srep04987

SUMMARY OF THE INVENTION

Problems to be Solved by the Invention

The present invention has been achieved under such circumstances. It is an object of the invention to provide a polycrystalline dielectric thin film and a capacitor element having high manufacturing efficiency and high relative permittivity.

Solution to Problem

A polycrystalline dielectric thin film according to the present invention comprises a main component of a perovskite-type oxynitride,
wherein the perovskite-type oxynitride is represented by a composition formula of $A_{a1}B_{b1}O_oN_n$ (a1+b1+o+n=5), and
wherein an a-axis length of a crystal lattice of the perovskite-type oxynitride is larger than its theoretical value.

Preferably, all of the a-axis length, a b-axis length, and a c-axis length of the crystal lattice are larger than their theoretical values.

Preferably, the polycrystalline dielectric thin film according to the present invention comprises an octahedron structure of $BO_4N_2$, wherein an arrangement of N in the octahedron structure is cis-type.

Preferably, a sum of an average valence of A-site ions and an average valence of B-site ions is seven.

Preferably, the a-axis length is 1.002 times or more its theoretical value.

A capacitor element according to the present invention comprises the polycrystalline dielectric thin film.

MODES FOR CARRYING OUT THE INVENTION

Hereinafter, the present invention is described based on an embodiment.

Figure 1:
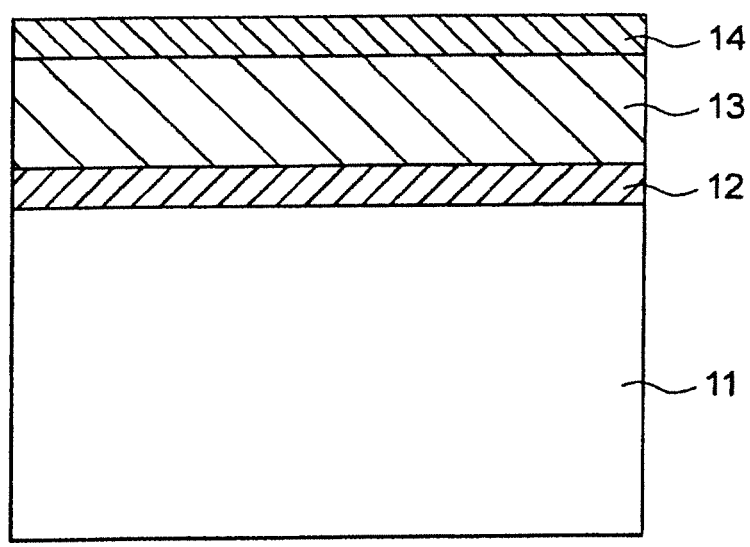
FIG. 1 is a schematic view of a thin film capacitor according to an embodiment of the present invention.

FIG. 1 shows a schematic view of a thin film capacitor according to the present embodiment. In a thin film capacitor 1 shown in FIG. 1, a lower electrode 12 and a polycrystalline dielectric thin film 13 are formed in this order on a substrate 11, and an upper electrode 14 is formed on the surface of the polycrystalline dielectric thin film 13.

The thin film according to the present embodiment refers to a material that is formed again after a raw material compound used for manufacture of a thin film is once separated or excited to an atomic or molecular level. Thus, a compound formed by application of slurry etc. is not included in the thin film according to the present embodiment.

The substrate 11 is made of any material, but if the substrate 11 is a Si single crystal substrate, it is excellent in availability and cost.

The lower electrode 12 and the upper electrode 14 are made of any materials that allow them to work as an electrode, such as Pt, Ag, Ni, etc. Preferably, the lower electrode 12 has a thickness of 0.01 to 10 μm. Preferably, the upper electrode 14 has a thickness of 0.01 to 10 μm.

The polycrystalline dielectric thin film 13 is a polycrystalline dielectric thin film having a main component of a perovskite-type oxynitride.

The perovskite-type oxynitride can be represented by a composition formula of $A_{a1}B_{b1}O_oN_n$ (a1+b1+o+n=5), where "A" is A-site ions of the perovskite-type oxynitride, and "B" is B-site ions of the perovskite-type oxynitride.

Preferably, "A" is one or more elements selected from Sr, Ba, Ca, La, Ce, Pr, Nd, and Na. "A" is more preferably one or more elements selected from Sr, Ba, La, and Nd because high capacitance can be obtained, and "A" is the most preferably Sr. Preferably, "B" is one or more elements selected from Ta, Nb, Ti, and W. "B" is more preferably one or more elements selected from Ta and Ti because a polycrystalline dielectric thin film 13 having less different phases can be obtained, and "B" is the most preferably Ta.

When "A" is Sr or Ba, "B" is preferably Ta. When "A" is Nd or La, "B" is preferably Ti.

In the perovskite-type oxynitride, a total of an average valence of A-site ions and an average valence of B-site ions is 6.7 to 7.3, preferably 7.

Here, the average valence refers to an averaged value of valences of ions present in the A-site and B-site based on their abundance ratio. For example, there is a case where Sr and La are present by 4:1 in the A-site and Ta and Ti are present in the B-site by 4:1. The valence of Sr ions is two, and the valence of La ions is three. Thus, α is calculated by Formula (1) below, where a is the average valence of Sr and La in this case. Moreover, the valence of Ta ions is five, and the valence of Ti ions is four. Thus, β is calculated by Formula (2) below, where β is the average valence of Ta and Ti in this case. Then, α=2.2 and β=4.8 are satisfied, and the total (α+β) of these average valences is seven.

$$\begin{aligned}\alpha =\ & (\text{valence of Sr ions})\times(\text{abundance ratio of Sr ions})+ \\ & (\text{valence of La ions})\times(\text{abunbdance ratio of La ions}) \\ =\ & 2\times 4/5 + 3\times 1/5 \\ =\ & 2.2\end{aligned} \quad \text{Formula (1)}$$

$$\begin{aligned}\beta =\ & (\text{valence of Ta ions})\times(\text{abundance ratio of Ta ions})+ \\ & (\text{valence of Ti ions})\times(\text{abundance ratio of Ti ions}) \\ =\ & 5\times 4/5 + 4\times 1/5 \\ =\ & 4.8\end{aligned} \quad \text{Formula (2)}$$

Incidentally, a total of average valences of the present application is calculated with a/b=1 when having A-site rich or B-site rich, that is, even if having a/b≠1. In the above case, for example, the total of average valences is 2.2+4.8=7 even if having a/b=1.2.

Moreover, in the polycrystalline dielectric thin film according to the present embodiment, an a-axis length of a crystal lattice is larger than its theoretical value. The a-axis length of the crystal lattice is measured by any method, such as XRD. The a-axis length of the crystal lattice in the present embodiment is calculated provided that a space group is I4/mcm, which is one of tetragonal space groups.

Here, a theoretical value in the present embodiment refers to an axial length calculated from first-principles calculations provided that an arrangement of N is cis-type in each composition represented by $A_{a1}B_{b1}O_oN_n$ (a1+b1+o+n=5). As for $SrTaO_2N$, there is a correspondence between an axial length obtained by XRD analysis of a sintered body that is a polycrystalline sintered body actually synthesized and has a controlled composition ratio and an axial length calculated from first-principles calculations provided that an arrangement of N is cis-type. This is the case with $LaTiO_2N$.

Then, the theoretical value of an a-axis length of a crystal lattice according to the present embodiment is an a-axis length, provided that a space group of the crystal structure of the polycrystalline dielectric thin film according to the present embodiment is I4/mcm, which is one of tetragonal space groups, and that a1=1, b1=1, o=2, and n=1 are satisfied. Incidentally, the theoretical value of the a-axis length differs in accordance with type of A-site element and/or B-site element.

In the polycrystalline dielectric thin film according to the present embodiment, the larger an a-axis length of a crystal lattice is, the better a relative permittivity improves. When an a-axis length is equal to or larger than its theoretical value, relative permittivity tends to be higher than relative permittivity when an a-axis length is less than its theoretical value. Moreover, the larger "n" is and the larger an N content of the polycrystalline dielectric thin film is, the larger an a-axis length tends to be. Specifically, when an N content of an entire perovskite-type oxynitride is 14 atom % or more, an a-axis length is easily equal to or larger than its theoretical value, and relative permittivity is easily improved. Preferably, the a-axis length is 1.002 times or more its theoretical value. More preferably, all of the a-axis length, a b-axis length, and a c-axis length are equal to or larger than their theoretical values.

Here, the reason why relative permittivity becomes higher as the a-axis length is longer is unknown, but the present inventors consider that this is because the amount of displacement of B-site ions in an octahedral structure of $BO_4N_2$ mentioned below increases.

In a dielectric porcelain composition that includes a perovskite-type oxynitride and is not a thin film, however, the change in N content also affects the a-axis length, but the a-axis length is approximately around its theoretical value.

It is unknown why the change in N content greatly affects the a-axis length in case of a polycrystalline dielectric thin film as compared with in case of a dielectric porcelain composition, but the present inventors consider that this is because the heating temperature during manufacture of the dielectric porcelain composition is a high temperature of approximately 1300 to 1600° C., while the heating temperature during manufacture of the polycrystalline dielectric thin film mentioned below (the temperature at which the perovskite-type oxynitride is crystallized) is a low temperature of approximately 600 to 800° C.

It is also unknown why relative permittivity improves better as the a-axis length increases, but the present inventors consider that this is because the volume of the crystal lattice increases as the a-axis length increases, and relative permittivity increases as the volume of the crystal lattice increases.

Hereinafter, a case of a perovskite-type oxynitride of $Sr_{a1}Ta_{b1}O_oN_n$ is described as an example, but this case also applies to a case where A-site element and/or B-site element is/are different. Incidentally, when A-site element is Sr and B-site element is Ta, the theoretical value of the a-axis length is 5.965 Å. Preferably, when A-site element is Sr and B-site element is Ta, the a-axis length is 5.705 Å or more.

Preferably, the polycrystalline dielectric thin film 13 comprises an octahedral structure of $BO_4N_2$, and the main arrangement of N in the octahedral structure is cis-type.

Figure 2A:
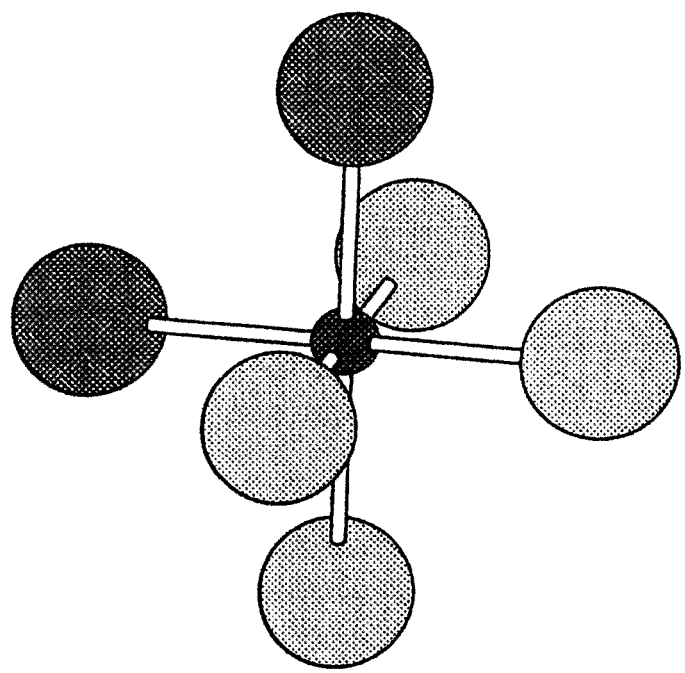
FIG. 2A is a schematic view showing a case where an arrangement of N is cis-type.
Figure 2B:
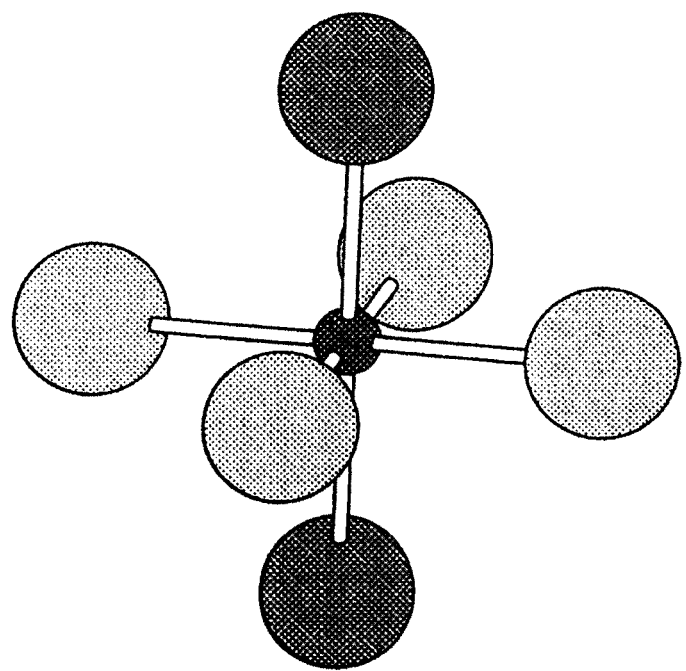
FIG. 2B is a schematic view showing a case where an arrangement of N is trans-type.

Now, a structure where N takes a cis arrangement is a structure where two Ns are arranged adjacent to each other as shown in FIG. 2A. On the other hand, a structure where N takes a trans arrangement is a structure where two Ns are not adjacent to each other as shown in FIG. 2B.

Figure 3A:
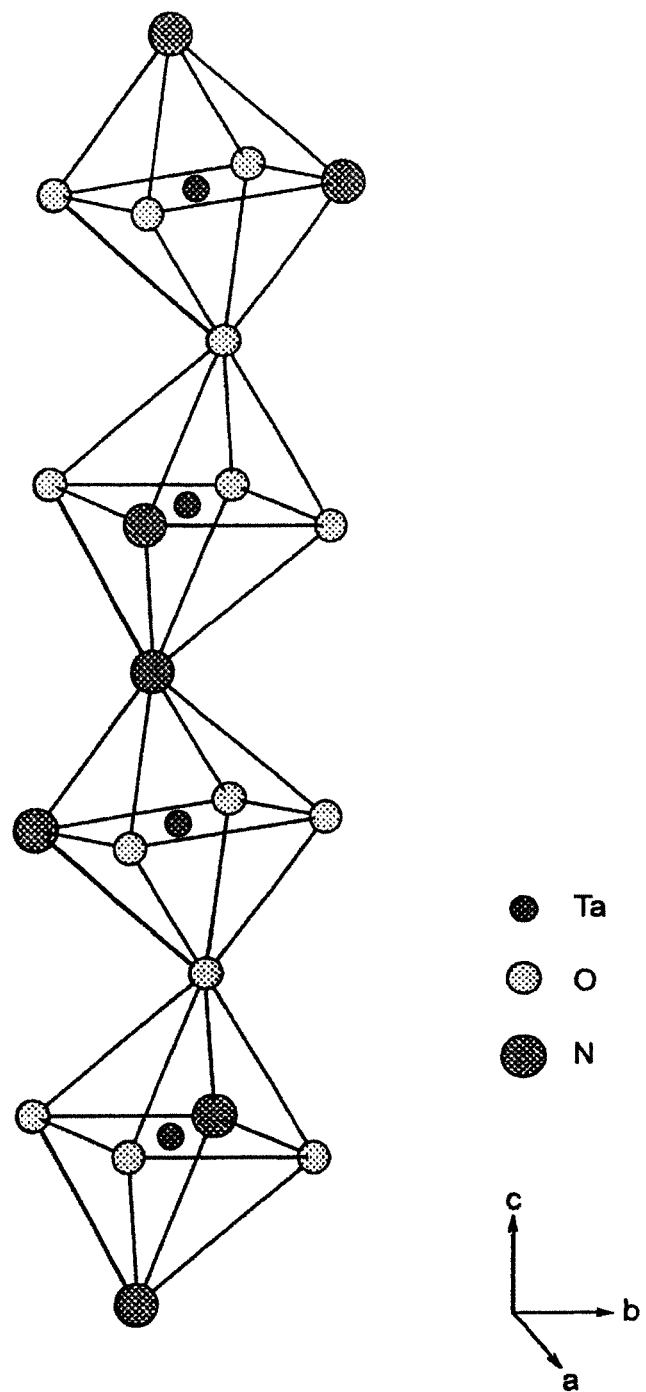
FIG. 3A is a schematic view showing a case where an arrangement of N is cis-type.
Figure 3B:
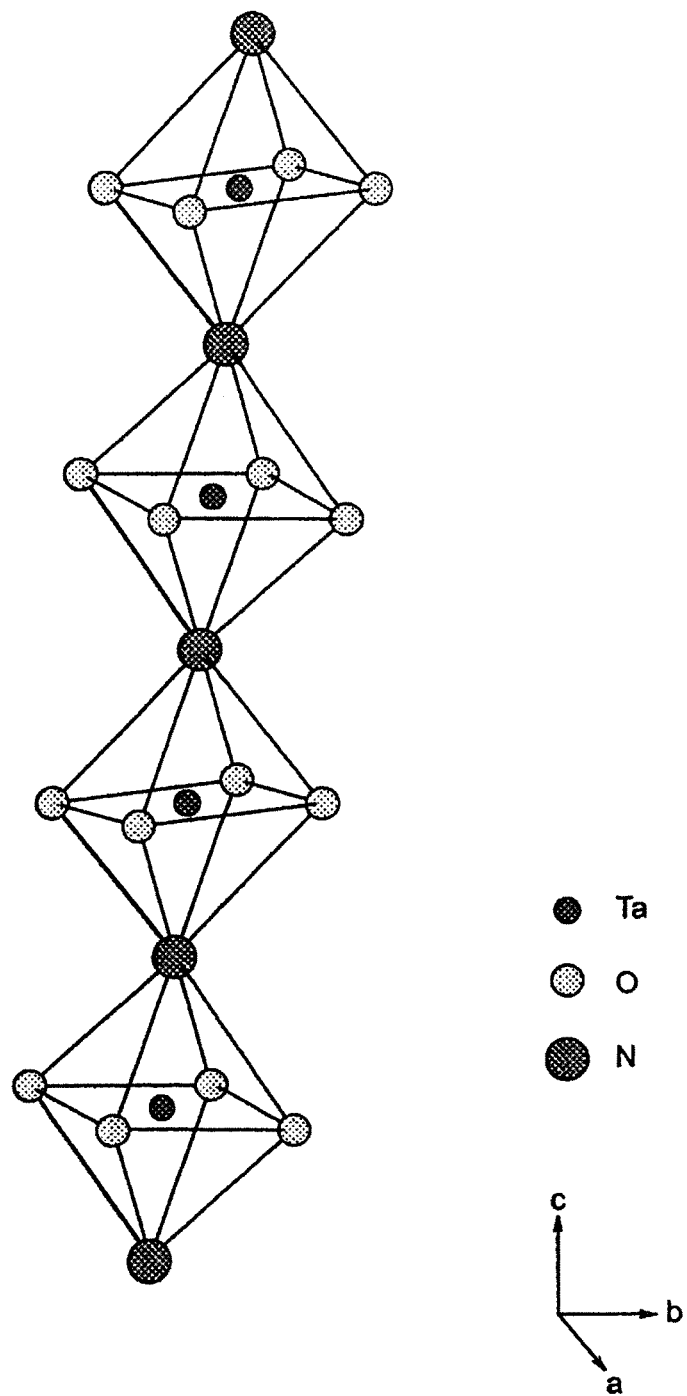
FIG. 3B is a schematic view showing a case where an arrangement of N is trans-type.

For each case of a cis arrangement of N and a trans arrangement of N, FIG. 3A and FIG. 3B illustrate that a plurality of octahedron structures is connected.

In the polycrystalline dielectric thin film according to the present embodiment, a neutron diffraction can confirm that N mainly takes a cis arrangement. Even if no neutron diffraction is carried out, it is known that N takes a stable cis arrangement provided that $ABO_2N$ is polycrystalline. On the other hand, if $ABO_2N$ of trans arrangement is desired to be obtained, a special state where the trans arrangement is more stable needs to be prepared by applying a substrate stress to single crystals of $ABO_2N$, such as epitaxial growth of the substrate as shown in Non-Patent Document 1. In polycrystals mainly having a cis arrangement, however, a trans arrangement is not normally completely zero. Even if a cis structure is stable, some of N may be disordered due to thermal motion or the like, and the trans arrangement may be taken. Even in such a case, the cis structure is dominant as the overall number, and the neutron diffraction consequently obtains a result of cis structure from the existence probability of the site.

Now, the polycrystalline dielectric thin film according to the present embodiment is a thin film that is different kind from an epitaxial film.

Figure 4:
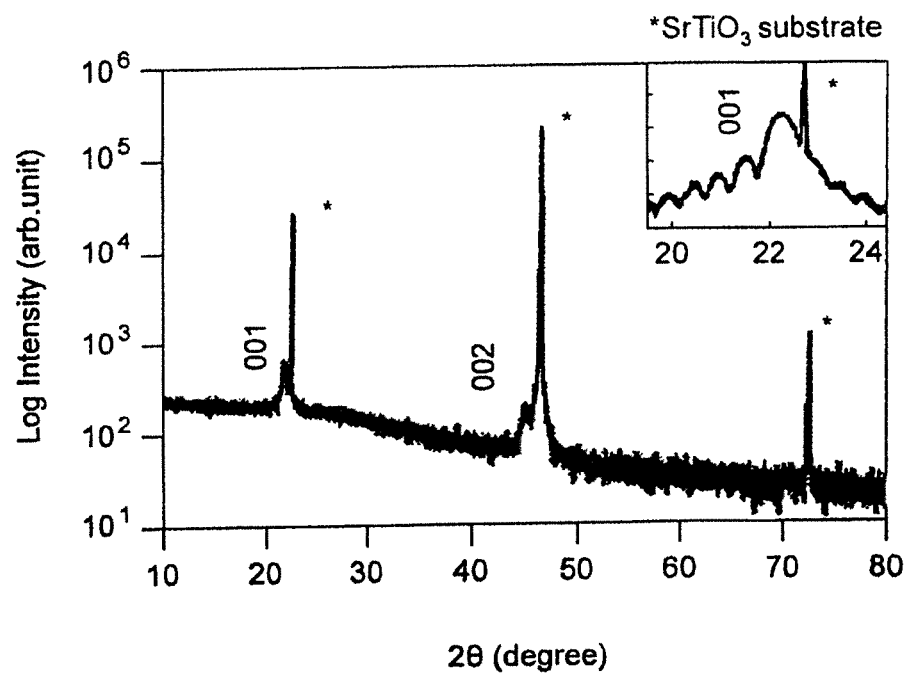
FIG. 4 is a schematic view of an XRD pattern of an epitaxial film comprising $CaTaO_2N$.

In order to confirm that the polycrystalline dielectric thin film according to the present embodiment is not an epitaxial film, an XRD data of an epitaxial film having a perovskite-type oxynitride of $SrTaO_2N$ is created, and it is confirmed that there is no common peak by comparing with an XRD data of the polycrystalline dielectric thin film according to the present embodiment. Incidentally, FIG. 4 is an XRD date of an epitaxial film having a perovskite-type oxynitride of $CaTaO_2N$. An XRD data of an epitaxial film of $SrTaO_2N$ is created similarly to FIG. 4. If there is a peak in the XRD data and if a crystal surface due to the peak is not only a specific crystal surface, it can be confirmed that a thin film is a polycrystalline film.

The polycrystalline dielectric thin film 13 is one of polycrystalline films, and is also one of dielectric thin films. The polycrystalline dielectric thin film 13 has any thickness, but preferably has a thickness of 10 nm to 1 μm.

Method of Manufacturing Thin Film Capacitor 1

Next, a method of manufacturing the thin film capacitor 1 is described. Hereinafter, A-site atom is Sr and B-site atom is Ta, but the thin film capacitor 1 is manufactured similarly even if other elements are employed.

A thin film to finally be the polycrystalline dielectric thin film 13 is formed by any method, such as vacuum deposition method, sputtering method, pulsed laser deposition method (PLD method), metal organic chemical vapor deposition method (MO-CVD), organic metal decomposition method (MOD), sol-gel method, and chemical solution deposition method (CSD). Minute impurities and auxiliary components may be contained in raw materials used for film formation, but this is not a problem so long as they do not significantly impair the performance of the thin film. Likewise, the polycrystalline dielectric thin film 13 according to the present embodiment may include minute impurities and auxiliary components so long as they do not significantly impair the performance.

If the polycrystalline dielectric thin film 13 according to the present embodiment is formed by a PLD method, a sputtering method, a CSD method, or the like among the above-mentioned methods, a thin film to be finally obtained easily becomes a polycrystalline film. If the polycrystalline dielectric thin film 13 according to the present embodiment is formed by a PLD method, a sputtering method, a CSD method, or the like, the a-axis length of the crystal lattice tends to be long. If the polycrystalline dielectric thin film 13 according to the present embodiment is formed by a PLD method, a sputtering method, a CSD method, or the like, a main arrangement of N is easily cis-type. The thin film can be formed by a CVD method, but the number of component elements is large, and a PLD method and a sputtering method thereby have higher composition controllability. In the present embodiment, a method of manufacturing the film by a PLD method is described.

First, a Si single crystal substrate is prepared as the substrate 11. Next, films of $SiO_2$, $TiO_x$, and Pt are formed in this order on the Si single crystal substrate, and the lower electrode 12 comprising Pt is formed. The lower electrode 12 is formed by any method, such as sputtering method and CVD.

Next, a metal oxide thin film is formed on the lower electrode 12 by a PLD method. For exposure of part of the lower electrode 12, a region where the thin film is not partly formed is formed using a metal mask.

In the PLD method, first, a target including constituent elements of an objective polycrystalline dielectric thin film is placed in a deposition chamber. Next, a pulse laser is irradiated against the surface of the target. The surface of the target is instantly vaporized by a strong energy of the pulse laser. Then, a metal oxide thin film is formed by depositing the vaporized product on a substrate disposed to face the target.

The target is any kind, such as alloys, nitride sintered materials, and metal oxynitride sintered materials, in addition to metal oxide sintered materials containing constituent elements of a polycrystalline dielectric thin film to be manufactured. In the target, each element is preferably homogeneously distributed, but may be distributed heterogeneously so long as the quality of a polycrystalline dielectric thin film to be obtained is not affected. Moreover, the target is not necessarily one, and a plurality of targets containing some of the constituent elements of the polycrystalline dielectric thin film may be prepared and used for formation of the thin film. The target has any shape that is suitable for a film formation device to be used. For example, when a polycrystalline dielectric thin film finally obtained has a composition of $Sr_{a1}Ta_{b1}O_oN_n$, a sintered material containing $Sr_2Ta_2O_7$ is prepared as a target. Moreover, adjusting film formation conditions (gas pressure of oxygen, gas pressure of nitrogen, size of film formation chamber, position of gas introduction tube, etc.) makes it easier to increase an N content of the polycrystalline dielectric thin film 13 finally obtained and to increase an a-axis length of crystal lattice. For example, lowering the gas pressure of oxygen during film formation tends to increase an N content of the polycrystalline dielectric thin film 13 finally obtained and to easily increase an a-axis length of crystal lattice.

In the PLD method, the substrate 11 is preferably heated by an infrared laser during film formation for crystallization of a metal oxide thin film to be formed. The heating temperature of the substrate 11 varies based on constituent elements, composition, and the like of the metal oxide thin film and the substrate 11, but for example, the film formation is carried out by heating at 600 to 800° C. If the substrate 11 has an appropriate temperature, the metal oxide thin film is crystallized easily, and cracking generated at cooling can be prevented from occurring.

If a nitriding treatment is carried out by introducing nitrogen radical during film formation, the polycrystalline dielectric thin film 13 comprising a perovskite-type oxynitride can be obtained.

Finally, the upper electrode 14 is formed on the polycrystalline dielectric thin film 13, and the thin film capacitor 1 can be thereby manufactured. Incidentally, the upper electrode 14 is made of any material, such as Ag, Au, and Cu. Moreover, the upper electrode 14 is formed by any method, such as sputtering method.

An embodiment of the present invention is described above, but the present invention is not limited to the embodiment, and may of course be achieved in variously different embodiments within the scope not deviating the gist thereof.

Incidentally, the capacitor element according to the present invention refers to an element utilizing dielectricity, and includes a capacitor, a thermistor, a filter, a diplexer, a resonator, a transmitter, an antenna, a piezoelectric element, a transistor, a ferroelectric memory, and the like. The polycrystalline dielectric thin film according to the present embodiment is advantageously used as a capacitor element particularly requiring high relative permittivity.

EXAMPLES

Hereinafter, the present invention is described based on more detailed examples, but is not limited thereto.

Initially, a $SrCO_3$ powder and a $Ta_2O_5$ powder were prepared as raw materials of a $Sr_2Ta_2O_7$ sintered material used as a target for film formation. The $SrCO_3$ powder and the $Ta_2O_5$ powder were weighed so that a mol ratio of Sr/Ta was 1.

Next, a mixed slurry was obtained by mixing the $SrCO_3$ powder and the $Ta_2O_5$ powder for 16 hours in a wet ball mill using an ethanol solvent.

Next, the mixed slurry was dried for 12 hours at 80° C. in a constant temperature dryer, and a mixture was obtained.

Next, the mixture was lightly crushed in a mortar and placed in a ceramic crucible. Then, the crushed mixture was heated for 2 hours at 1000° C. in an air atmosphere using an electric furnace, and a calcined product was obtained.

Next, the calcined product was once again mixed for 16 hours in a wet ball mill using an ethanol solvent, and a calcined slurry was obtained.

The resulting calcined slurry was dried for 12 hours at 80° C. in a constant temperature dryer, and a calcined mixture was obtained.

The calcined mixture was added with a polyvinyl alcohol solution as a binder and mixed, and a granulated product was obtained. The polyvinyl alcohol solution was added in an amount of 0.6 wt % with respect to 100 wt % of the granulated product.

The granulated product was molded into a column shape having a diameter of about 23 mm and a height of about 9 mm, and a molded product was obtained. The granulated product was molded by CIP molding. Incidentally, the granulated product was molded at 150 MPa.

The molded product was fired for 2 hours at 1400° C. in an atmosphere using an electric furnace, and a sintered product was obtained. Moreover, top and bottom surfaces of the sintered product were mirror-polished, and a film-forming target having a height of 5 mm was obtained. Incidentally, it was confirmed that the resulting film-forming target had a relative density of 96 to 98%.

The film-forming target obtained as described above was set in a film forming apparatus, and a Si substrate was placed to face the film-forming target. A Pt film as a lower electrode was on the surface of the Si substrate.

Then, a thin film was formed to have a thickness of 200 nm by a PLD method. The polycrystalline dielectric thin film was obtained by introducing nitrogen radial and carrying out a nitriding treatment during the film formation. The film formation was carried out for 0.5 to 2 hours.

Since oxygen and nitrogen enter the same site in the crystal lattice, a large amount of N is introduced into the lattice if a partial pressure of oxygen is lowered, and the introduction of N is hindered if a partial pressure of oxygen is increased. Here, a large number of thin film samples with different nitrogen content was prepared by controlling a partial pressure of oxygen between 0 and 0.1 Pa and controlling a required time for the nitriding treatment between 0.5 and 2 hours.

XRD patterns of the thin film samples obtained were measured using a fully automatic horizontal multi-objective X-ray diffractometer SmartLab manufactured by Rigaku Corporation, and it was confirmed that all of the thin film samples obtained were not epitaxial films. Moreover, the N content of the thin film samples obtained were quantified by an impulse heating melt extraction method (infrared absorption method) using TC 600 manufactured by LECO. In addition, valence of Sr ions and valence of Ta ions were determined from XPS chemical shift, and it was confirmed that there was no change in valence from the raw materials. Specifically, the valence number of Sr ions was two, and the valence number of Ta ions was five.

From the XRD pattern of the thin film samples obtained in Experimental Example 1, it was confirmed that all of the examples in Experimental Example 1 had a polycrystalline film. That is, it was confirmed that the thin films were crystallized and a polycrystalline thin film. It was also confirmed that the resulting polycrystalline thin films were not an oriented film oriented to a specific plane. This was a state where a cis arrangement was stable.

Figure 5:
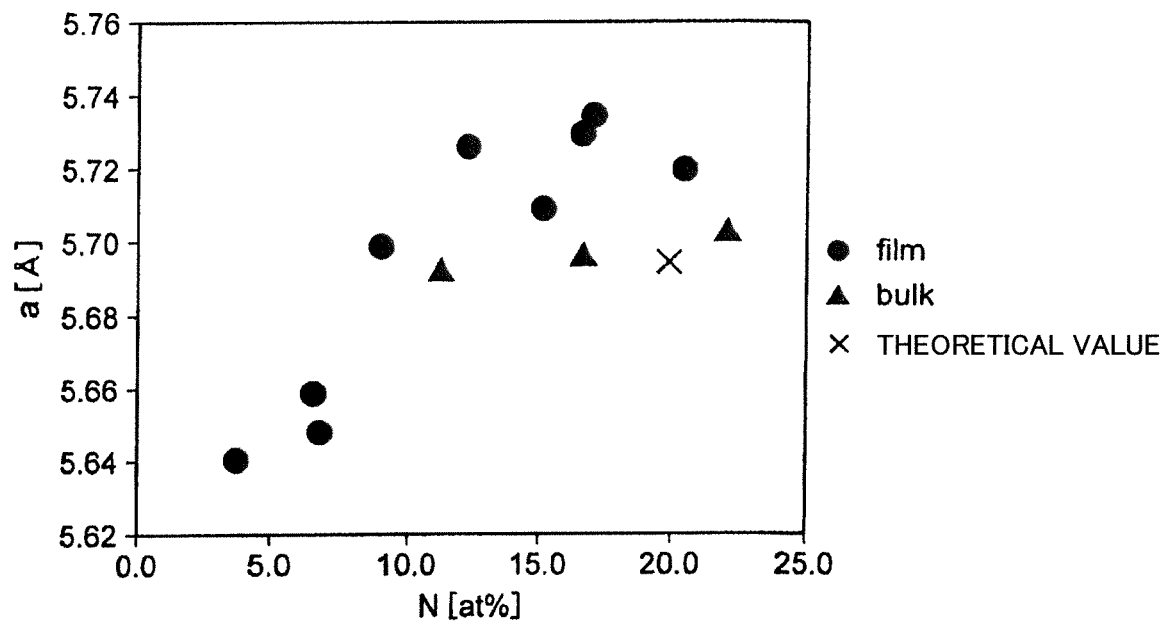
FIG. 5 is a graph showing a relation between a-axis length and N content.

Subsequently, a-axis lengths and c-axis lengths of the resulting thin film samples were calculated from the XRD patterns. The results are shown in Table 1. Moreover, FIG. 5 shows a graph whose vertical axis refers to a-axis length and horizontal axis refers to N content. Incidentally, "film" of Table 1 and FIG. 5 is a thin film.

In response to the polycrystalline dielectric thin films, bulk dielectric porcelain compositions were manufactured by the following method.

First, a perovskite-type $SrTaO_2N$ powder was manufactured by a solid-phase method.

As raw material powders of the perovskite-type $SrTaO_2N$ powder, a strontium carbonate ($SrCO_3$) powder and a tantalum oxide ($Ta_2O_5$) powder were prepared so that a substance quantity of Sr and a substance quantity of Ta were approximately the same.

Next, a $Sr_2Ta_2O_7$ precursor was obtained by heating the $SrCO_3$ powder and the $Ta_2O_5$ powder at 1200° C. for 25 hours while pulverizing them every 10 hours. This heating atmosphere was an air.

Next, a perovskite-type $SrTaO_2N$ powder was obtained by carrying out a nitriding reaction for the resulting $Sr_2Ta_2O_7$ precursor. A vacuum furnace was used in the nitriding reaction. After the atmosphere in the furnace was set to vacuum, $N_2$ was supplied at 100 ml/min, and the $Sr_2Ta_2O_7$ precursor kneaded with C was heated at 1400° C. for 6 hours, whereby a perovskite-type $SrTaO_2N$ powder was obtained. The N content of a dielectric porcelain composition finally obtained tends to increase as the amount of C kneaded before the heat treatment in the vacuum furnace is larger. This is because the O content of the perovskite-type $SrTaO_2N$ is decreased due to vaporization of CO from oxidation of C during sintering mentioned below.

Next, the perovskite-type $SrTaO_2N$ powder was subjected to CIP molding at 150 MPa, and a molded product having a diameter of about 12 mm and a height of about 1 mm was obtained.

The molded product was fired in an atmosphere having a nitrogen partial pressure of 0.2 MPa at 1400° C. for 8 hours, and a sintered product was obtained.

Then, N content, a-axis length, and c-axis length were measured similarly to the thin film samples. The results are shown in Table 1 and FIG. 5. Incidentally, "bulk" of Table 1 and FIG. 5 refers to a bulk dielectric porcelain composition.

TABLE 1

|  | Shape | N[at %] | a-axis[Å] | c-axis[Å] | c/a |
|---|---|---|---|---|---|
| Ex. 1 | film | 15.1 | 5.7090 | 8.0481 | 1.4097 |
| Ex. 2 | film | 12.3 | 5.7259 | 7.9900 | 1.3954 |
| Ex. 3 | film | 17.1 | 5.7344 | 8.0795 | 1.4090 |
| Ex. 4 | film | 16.7 | 5.7294 | 8.0779 | 1.4099 |
| Ex. 5 | film | 20.5 | 5.7198 | 8.0800 | 1.4126 |
| Ex. 6 | film | 9.0 | 5.6988 | 8.0077 | 1.4052 |
| Comp. Ex. 1 | film | 6.5 | *5.6591* | 8.0326 | 1.4194 |
| Comp. Ex. 2 | film | 6.8 | *5.6480* | 8.0361 | 1.4228 |
| Comp. Ex. 3 | film | 3.7 | *5.6406* | 7.9911 | 1.4167 |
| Comp. Ex. 4 | *bulk* | 11.3 | *5.6924* | 8.0621 | 1.4163 |
| Comp. Ex. 5 | *bulk* | 16.7 | 5.6967 | 8.0626 | 1.4153 |
| Comp. Ex. 6 | *bulk* | 22.1 | 5.7030 | 8.0722 | 1.4154 |
| Theoretical Value |  | 20.0 | 5.6941 | 8.0658 | 1.4165 |

According to Table 1 and FIG. 5, the a-axis length was larger as the N content was larger and a large number of thin film samples whose N content was large and a-axis length exceeded their theoretical values was manufactured in the thin film samples, while the a-axis lengths were approximately equal to their theoretical values in the bulk dielectric porcelain compositions. Moreover, the change in a-axis length to the change in N content in the bulk dielectric porcelain compositions was smaller than that in the thin film samples.

DESCRIPTION OF THE REFERENCE NUMERALS

1 . . . thin film capacitor
11 . . . substrate
12 . . . lower electrode
13 . . . polycrystalline dielectric thin film
14 . . . upper electrode

The invention claimed is:

1. A polycrystalline dielectric thin film, comprising a main component of a perovskite-type oxynitride,
wherein the perovskite-type oxynitride is represented by a composition formula of $Sr_{a1}Ta_{b1}O_oN_n$ (a1+b1+o+n=5),
wherein an a-axis length of a crystal lattice of the perovskite-type oxynitride is larger than a theoretical value of a-axis length of the perovskite-type oxynitride, and
wherein the a-axis length is 5.695 Å or more.

2. The polycrystalline dielectric thin film according to claim 1, wherein all of the a-axis length, a b-axis length, and a c-axis length of the crystal lattice are larger than their theoretical values of the a-axis length of the perovskite-type oxynitride, a b-axis length of the perovskite-type oxynitride, and a c-axis length of the perovskite-type oxynitride, respectively.

3. The polycrystalline dielectric thin film according to claim 1, comprising an octahedron structure of $TaO_4N_2$, wherein an arrangement of N in the octahedron structure is cis-type.

4. The polycrystalline dielectric thin film according to claim 2, comprising an octahedron structure of $TaO_4N_2$, wherein an arrangement of N in the octahedron structure is cis-type.

5. The polycrystalline dielectric thin film according to claim 1, wherein a sum of an average valence of A-site ions and an average valence of B-site ions is seven.

6. The polycrystalline dielectric thin film according to claim 2, wherein a sum of an average valence of A-site ions and an average valence of B-site ions is seven.

7. The polycrystalline dielectric thin film according to claim 1, wherein the a-axis length is 5.705 Å or more.

8. The polycrystalline dielectric thin film according to claim 2, wherein the a-axis length is 5.705 Å or more.

9. The polycrystalline dielectric thin film according to claim 1, wherein the film has a thickness of 10 nm to 1 μm.

10. The polycrystalline dielectric thin film according to claim 2, wherein the film has a thickness of 10 nm to 1 μm.

11. A capacitor element comprising the polycrystalline dielectric thin film according to claim 1.

12. A capacitor element comprising the polycrystalline dielectric thin film according to claim 2.

* * * * *